(12) United States Patent
Kadowaki et al.

(10) Patent No.: US 8,765,584 B2
(45) Date of Patent: Jul. 1, 2014

(54) SEMICONDUCTOR DEVICE AND MANUFACTURING METHOD THEREFOR

(75) Inventors: Yoshitaka Kadowaki, Tokyo (JP); Tatsunori Toyota, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 100 days.

(21) Appl. No.: 13/516,889

(22) PCT Filed: Jul. 26, 2011

(86) PCT No.: PCT/JP2011/004209
§ 371 (c)(1),
(2), (4) Date: Jun. 18, 2012

(87) PCT Pub. No.: WO2012/014448
PCT Pub. Date: Feb. 2, 2012

(65) Prior Publication Data
US 2012/0256327 A1    Oct. 11, 2012

(30) Foreign Application Priority Data
Jul. 30, 2010    (JP) .................................. 2010-172283

(51) Int. Cl.
*H01L 21/28*    (2006.01)
*H01L 21/44*    (2006.01)

(52) U.S. Cl.
USPC ........... 438/577; 438/602; 438/141; 438/311; 438/681; 257/E21.006; 257/E21.042; 257/E21.051; 257/E21.053; 257/E21.126; 257/E21.127; 257/E21.128; 257/E21.267; 257/E21.278; 257/E21.379

(58) Field of Classification Search
USPC ......... 438/577, 311, 141, 602, 603, 604, 621, 438/612, 634, 681; 257/E21.006, E21.042, 257/E21.051, E21.053, E21.17, E21.126, 257/E21.127, E21.128, E21.267, E21.278, 257/E21.379
See application file for complete search history.

(56) References Cited

U.S. PATENT DOCUMENTS 5,300,788 A * 4/1994 Fan et al. .................. 257/13
5,453,405 A * 9/1995 Fan et al. .................. 438/34

(Continued)

FOREIGN PATENT DOCUMENTS

JP    A-2003-273463    9/2003
JP    A-2007-234671    9/2007

(Continued)

OTHER PUBLICATIONS

International Preliminary Report on Patentability issued in Application No. PCT/JP2011/004209; Dated Feb. 5, 2013 (With Translation).
International Search Report issued in Application No. PCT/JP2011/004209; Dated Sep. 6, 2011 (With Translation).

*Primary Examiner* — David Nhu
(74) *Attorney, Agent, or Firm* — Oliff PLC

(57) ABSTRACT

A semiconductor device and a manufacturing method therefor, wherein, during lift-off, no cracks due to internal stresses occur in the compound semiconductor layer. A method for manufacturing a semiconductor device having a structure in which a semiconductor layer is bonded on a supporting substrate, including: a device region formation step of forming a device region including the semiconductor layer on a growth substrate through a lift-off layer; a columnar member formation step of forming a columnar member on the growth substrate; a bonding step of bonding the tops of the semiconductor layer and the columnar member to a supporting substrate; a lift-off step of separating the bottom face of the semiconductor layer from the growth substrate by removing the lift-off layer, and not separating the columnar member from the growth substrate; and a step of separating the columnar member from the supporting substrate.

16 Claims, 17 Drawing Sheets

(56) References Cited

U.S. PATENT DOCUMENTS

| | | | |
|---|---|---|---|
| 6,852,968 B1 * | 2/2005 | Ouchi et al. | 250/234 |
| 6,974,712 B2 * | 12/2005 | Ouchi et al. | 438/29 |
| 8,436,377 B2 * | 5/2013 | Lin et al. | 257/94 |
| 8,436,383 B2 * | 5/2013 | Jung | 257/98 |
| 2010/0148309 A1 | 6/2010 | Liang et al. | |

FOREIGN PATENT DOCUMENTS

| | | |
|---|---|---|
| JP | A-2009-218495 | 9/2009 |
| JP | A-2010-147166 | 7/2010 |
| JP | A-2010-182979 | 8/2010 |

\* cited by examiner (a)

(b)

(c)

(a)

(b)

(c)

cracks in the central portion (a)

(b)

(c)

SEMICONDUCTOR DEVICE AND MANUFACTURING METHOD THEREFOR

This application is a 35 U.S.C. §371 national stage entry of PCT/JP2011/004209 filed on Jul. 26, 2011, which claims priority under 35 U.S.C. §119 to Japanese Patent Application No. 2010-172283 filed on Jul. 30, 2010.

TECHNICAL FIELD

The present invention relates to a semiconductor device and a manufacturing method therefor, and particularly relates to a semiconductor device having a structure in which a compound semiconductor layer is formed on a supporting substrate and a manufacturing method therefor.

BACKGROUND ART

Group III nitride semiconductors, which are compound semiconductors, have a wide band gap, and therefore, they are widely used as materials for light-emitting devices, such as blue, green, and other color LEDs (light-emitting diodes), LDs (laser diodes), and the like. Such devices are configured by laminating a p-type semiconductor layer (p-type layer) and an n-type semiconductor layer (n-type layer) by the epitaxial growth process.

In order to manufacture such a structure with a good quality being provided at a low cost, a p-type layer and an n-type layer are epitaxially grown on a growth substrate made of a material other than the group III nitride semiconductor in general. In this case, the type of material which can be used as a growth substrate for obtaining a semiconductor layer with a particularly good quality is limited. For example, gallium nitride (GaN), a typical group III nitride semiconductor, can be grown on a growth substrate formed of SiC, sapphire, or the like, by the MOCVD (metal organic chemical vapor deposition) process, the HVPE (hydride vapor phase epitaxy) process, or the like.

However, since sapphire is an insulator, it is required to provide two electric contact portions on the top face of a semiconductor layer laminated thereon, which has caused problems that the effective light-emitting area is narrowed down for a given substrate area, as compared to the conductor substrate, and both electrodes being provided on the same face locally increases the current density, resulting in the device being deteriorated due to the heat generated.

Then, a method for manufacturing a light-emitting device utilizing the lift-off technology is disclosed (for example, Patent Document 1 to be referenced). With this manufacturing method, an n-type layer, a p-type layer, and a p-side electrode are sequentially formed on a sapphire substrate, which is followed by newly bonding a conductive substrate on the side of the p-side electrode as a supporting substrate.

CITATION LIST

Patent Literature

Patent Document 1
Japanese Unexamined Patent Application Publication No. 2007-234671

DISCLOSURE OF THE INVENTION

Problems to be Solved by the Invention

However, the lift-off technology requires that, at the time of peeling off the compound semiconductor layer from the sapphire growth substrate, the lift-off layer be etched from the circumference by means of an etching fluid, or the like, thereby the lift-off layer being gradually peeled off from the compound semiconductor layer, which has presented a problem that cracks can be initiated in the compound semiconductor layer, resulting from the internal stress due to the difference in coefficient of thermal expansion between the growth substrate and the compound semiconductor layer at the time of growth.

In view of the aforementioned problems, it is an object of the present invention to provide a semiconductor device and a manufacturing method therefor which are free from occurrence of cracks in the compound semiconductor layer due to the internal stress in the compound semiconductor layer at the time of lift-off.

Means for Solving the Problems

In order to achieve the aforementioned object, the semiconductor device and the manufacturing method therefor in accordance with the present invention are configured as follows.

The first method for manufacturing a semiconductor device is a method for manufacturing a semiconductor device having a structure in which a semiconductor layer is bonded on a supporting substrate, comprising: a device region formation step of forming a device region comprised of the semiconductor layer on a growth substrate through a lift-off layer; a columnar member formation step of forming a columnar member on the growth substrate; a bonding step of bonding the tops of the semiconductor layer and the columnar member to a supporting substrate; a lift-off step of separating the bottom face of the semiconductor layer from the growth substrate by removing the lift-off layer, and not separating the columnar member from the growth substrate; and a step of separating the columnar member from the supporting substrate.

The second method for manufacturing a semiconductor device is the aforementioned method, wherein preferably the columnar member formation step has a sacrificing layer formation step of forming a sacrificing layer in a portion of the columnar member, and in the step of separating the columnar member and the supporting substrate, the sacrificing layer is removed.

The third method for manufacturing a semiconductor device is the aforementioned method, wherein preferably the columnar member has a core member formed of the same material as that of the semiconductor layer.

The fourth method for manufacturing a semiconductor device is the aforementioned method, wherein preferably, in the device region formation step, after a material constituting the semiconductor layer being formed on the growth substrate through the lift-off layer, etching is performed to form the device region and the core member; and in the columnar member formation step, a protection layer which is not removed in the lift-off step is formed on the side face of the core member.

The fifth method for manufacturing a semiconductor device is the aforementioned method, wherein preferably the step of forming the lift-off layer on the growth substrate has a step of removing the lift-off layer in the region where the columnar member is to be formed, and after a material constituting the semiconductor layer being formed on the growth substrate through the lift-off layer, and partially being formed not through the lift-off layer, etching is performed to concurrently form the device region and the core member which is not lifted-off in the lift-off step.

The sixth method for manufacturing a semiconductor device is the aforementioned method, wherein preferably the step of forming the lift-off layer on the growth substrate has a step of selectively forming the lift-off layer in the device region and the region which is inside the region where the columnar member is to be formed, and after a material constituting the semiconductor layer being formed on the growth substrate through the lift-off layer, and partially being formed not through the lift-off layer, etching is performed to concurrently form the device region and the core member which is not lifted-off in the lift-off step.

The seventh method for manufacturing a semiconductor device is a method for manufacturing a semiconductor device having a structure in which a semiconductor layer is bonded on a supporting substrate, comprising: a device region formation step of forming a device region comprised of the semiconductor layer on a growth substrate through a lift-off layer; a columnar member formation step of forming a columnar member on the supporting substrate; a bonding step of bonding the semiconductor layer on the supporting substrate, and bonding the columnar member on the growth substrate; a lift-off step of separating the bottom face of the semiconductor layer from the growth substrate by removing the lift-off layer, and not separating the columnar member from the growth substrate; and a step of separating the columnar member from the supporting substrate.

The eighth method for manufacturing a semiconductor device is the aforementioned method, wherein preferably the columnar member formation step has a sacrificing layer formation step of forming a sacrificing layer on the supporting substrate, and in the step of separating the columnar member and the supporting substrate, the sacrificing layer is removed.

The ninth method for manufacturing a semiconductor device is the aforementioned method, wherein preferably the semiconductor layer has an n-type layer on the side of the growth substrate, and a p-type layer formed on the n-type layer.

The tenth method for manufacturing a semiconductor device is the aforementioned method, wherein preferably, before the bonding step, on the surface of the semiconductor layer in the device region, and on the surface of the supporting substrate, a conductive material is formed, respectively.

The eleventh method for manufacturing a semiconductor device is the aforementioned method, wherein preferably an n-type electrode which is to be bonded to the n-type layer is formed, and a p-type electrode which is to be bonded to the p-type layer is formed, the leakage current flowing when a reverse voltage of 10 volts is applied across the n-type electrode and the p-type electrode being less than 10 μA.

The first semiconductor device is a semiconductor device which is manufactured by any one of the first to eleventh methods for manufacturing a semiconductor device.

Effect of the Invention

In accordance with the present invention, there can be provided a semiconductor device and a manufacturing method therefor which are free from occurrence of cracks in the compound semiconductor layer due to the internal stress in the compound semiconductor layer at the time of lift-off.

BRIEF DESCRIPTION OF THE DRAWINGS

FIG. 6 is a sectional view of a substrate for one device in the respective steps of a modification of the method for manufacturing a semiconductor device according to the third embodiment of the present invention;

BEST MODE FOR CARRYING OUT THE INVENTION

Hereinafter, preferred embodiments (examples) of the present invention will be explained with reference to the accompanying drawings.

Hereinbelow, a method for manufacturing a semiconductor device according to the first embodiment of the present invention will be explained. The n-type and p-type semiconductor layers to be used in this semiconductor device are formed by epitaxial growth on a growth substrate. However, with a semiconductor device actually fabricated, this growth substrate is removed, and a supporting substrate which is different from the growth substrate is connected on the side opposite to the side where the growth substrate has been given.

Figure 1:
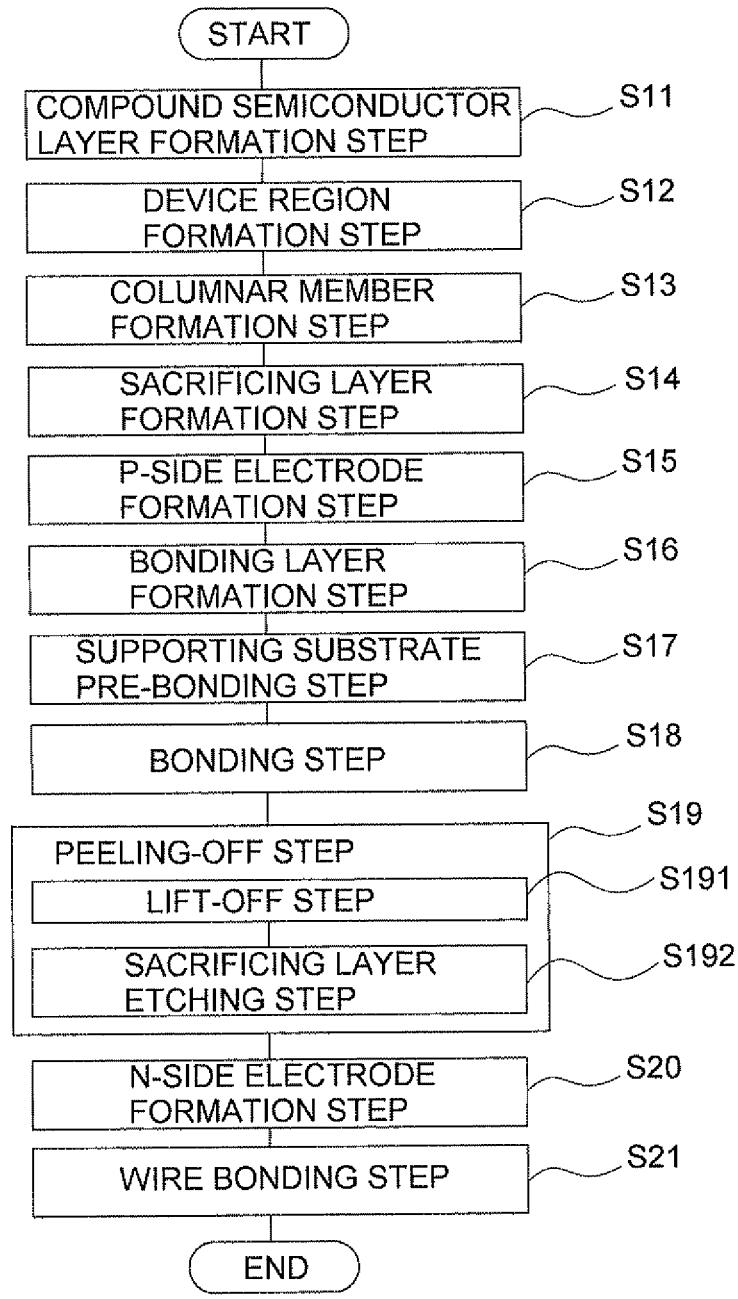
FIG. 1 is a flowchart showing the steps of manufacturing a semiconductor device by a manufacturing method therefor according to the first embodiment of the present invention.

FIG. 1 is a flowchart showing the steps of manufacturing a semiconductor device by a manufacturing method therefor according to the first embodiment of the present invention. FIG. 2 is a sectional view of a substrate in the respective steps of the method for manufacturing a semiconductor device according to the first embodiment of the present invention. Herein, the case where, as this semiconductor device, a light-emitting diode (LED) made of a nitride semiconductor is manufactured will be described. The nitride semiconductor is a semiconductor represented by a formula of, for example, $Al_xIn_yGa_zN$ ($0 \leq x \leq 1$, $0 \leq y \leq 1$, $0 \leq z \leq 1$, $x+y+z=1$). This LED uses luminescence in the laminate of an n-type layer and a p-type layer in the nitride semiconductor. In FIG. 2, a structure of one device of an LED is shown, however, actually, a plurality of LEDs can be formed on a single supporting substrate, and after formation of a plurality of devices on the substrate, these can be separated into individual devices, or can be connected in series or parallel for use.

The method of manufacturing a semiconductor device according to the first embodiment has a compound semiconductor layer formation step (step S11), a device region formation step (step S12), a columnar member formation step (step S13), a sacrificing layer formation step (step S14), a p-side electrode formation step (step S15), a bonding layer formation step (step S16), a supporting substrate pre-bonding step (step S17), a bonding step (step S18), a peeling-off step (step S19), an n-side electrode formation step (step S20), and a wire bonding step (step S21), the peeling-off step (step S19) being comprised of a lift-off step (step S191) and a sacrificing layer etching step (step S192), and in the lift-off step (step S191) in the peeling-off step (step S19), the columnar member being kept bonded. In other words, in the lift-off step (step S191), the bottom face of the semiconductor layer and the growth substrate are separated from each other by removing the lift-off layer, and the columnar member will not be separated from the growth substrate.

Figure 2A:
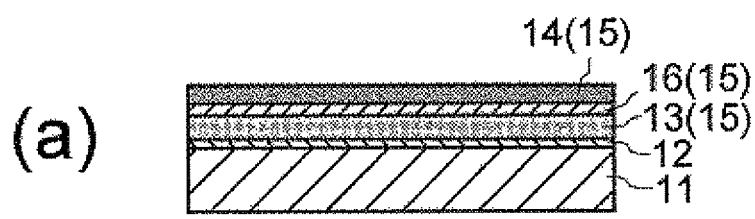
FIG. 2 is a sectional view of a substrate for one device in the respective steps of the method for manufacturing a semiconductor device according to the first embodiment of the present invention.

In the compound semiconductor layer formation step (step S11), a lift-off layer (metal buffer layer) is formed on the growth substrate, and a compound semiconductor layer is formed on the lift-off layer. First, as shown in FIG. 2(a), a metal buffer layer 12 is formed on a growth substrate 11. As the growth substrate 11, a sapphire single crystal ((0001) substrate) is particularly preferably used. Further, as the metal buffer layer 12 thereon, scandium (Sc) having a film thickness of, for example, 100 Å or so can be used. Film formation of the metal buffer layer 12 can be carried out by the sputtering method, the vacuum deposition method, or the like.

Next, in this state, a step of nitridation treatment is performed in an ammonia atmosphere at a high temperature of 1040° C. or over, for example. Thereby, the surface of the metal buffer layer (metal layer: Sc layer) 12 is nitrided to be a scandium nitride layer (metal nitride layer: ScN layer) 12s. The thickness of this ScN layer 12s can be set by adjusting the treatment time, the temperature, and the like.

Next, on the Sc metal buffer layer 12 having a ScN layer 12s, an n-type nitride semiconductor layer (n-type semiconductor layer: n-type layer) 13, and a p-type nitride semiconductor layer (p-type semiconductor layer: p-type layer) 14 are sequentially deposited (an epitaxial growth step). This film formation is performed by, for example, the metal organic chemical vapor deposition process (MOCVD process), an impurity serving as a donor being doped into the n-type layer 13, while an impurity serving as an acceptor into the p-type layer 14. By this epitaxial growth step, a laminate 15 comprised of an n-type layer 13 and a p-type layer 14 is formed, and therein a pn junction of a nitride semiconductor is formed to be a light-emitting layer 16. On the ScN layer 12s, an n-type layer 13 and a p-type layer 14 with less crystal defects can be grown. Accordingly, the nitride semiconductor in this laminate 15 can be of high quality, whereby the light emitting intensity can be enhanced.

Figure 2B:
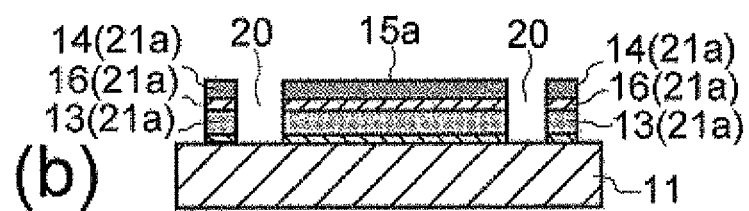

In the device region formation step (step S12), at least a part of the compound semiconductor layer (laminate) 15 is removed by etching to form a device region 15a, a core member 21a, and a separation groove 20 concurrently (FIG. 2(b)). When the device region is formed, a core member 21a for bonding the growth substrate 11 and the supporting substrate to each other is left around the device region. This core member 21a is formed of a compound semiconductor layer (laminate) 15. As shown in FIG. 2(b), the separation groove 20 has a depth ranging from the upper side (the p-type layer 14 side) in FIG. 2 to the surface of the growth substrate 11. Thereby, the laminate 15 is divided on the substrate 11. In FIG. 2(b), a section in one direction is shown, however, this separation groove 20 is also formed in a direction different therefrom, a device region 15a surrounded by the separation groove 20 being formed in a plurality of regions.

Formation of the separation groove 20 is performed in the following way, for example. $SiO_2$ is deposited on the compound semiconductor layer (laminate) 15 by the CVD process; a photo-resist is used to perform patterning; and etching is made with BHF to form a mask of $SiO_2$. Thereafter, using $SiO_2$ as a mask, the compound semiconductor layer is dry-etched until the sapphire substrate is exposed. Thereafter, BHF is used to remove the $SiO_2$ mask.

Figure 2C:
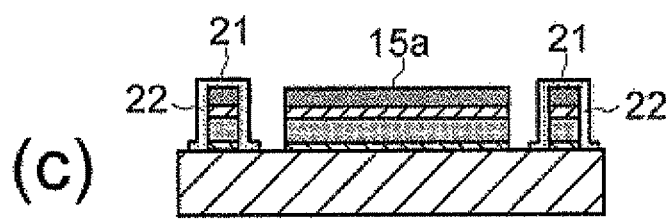

In the columnar member formation step (step S13), a protection film 22 is formed so as to cover the core member 21a and the metal buffer layer to form a columnar member 21. This is performed to prevent the core member 21a from being lifted-off in the lift-off step. The protection film 22 is formed by depositing $SiO_2$ (1 μm), for example (FIG. 2(c)). In FIG. 2(c), the protection film 22 covers the top of the core member 21a, however, a protection layer which is not removed in the lift-off step may be formed on the core member side face alone. In addition, as the protection layer, such a material as a metal, resin, or the like, may be used, provided that the material is not dissolved and peeled in the lift-off step, and by forming a sacrificing layer and a bonding layer so as to cover the core member and the metal buffer layer, the sacrificing layer and the bonding layer may also serve to provide a protection layer.

Figure 2D:
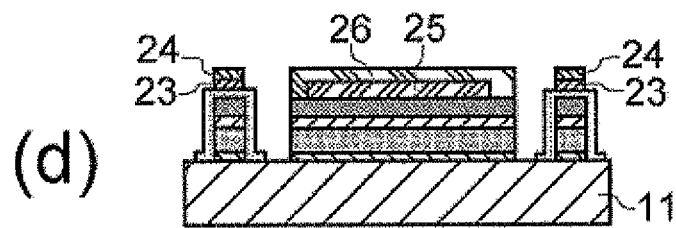

In the sacrificing layer formation step (step S14), as a sacrificing layer 23, Cr (250 Å), for example, is deposited on the top of the columnar member 21, and as a bonding layer 24, Pt/Au (2000 Å/1 μm), for example, is deposited thereon (FIG. 2(d)).

In the p-side electrode formation step (step S15), on the entire face of the p-type layer 14 located at the uppermost face, a material which can make an ohmic contact with the p-type layer 14 is deposited as a p-side electrode 25. For example, Ni/Au (50 Å/200 Å) is deposited and annealed.

In the bonding layer formation step (step S16), Pt/Au (2000 Å/2 μm), for example, is deposited as a bonding layer 26 (FIG. 2(d)).

Figure 2E:
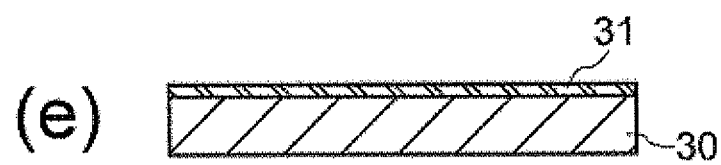

In the supporting substrate pre-bonding step (step S17), on one main face of a supporting substrate 30, which has been prepared besides the aforementioned structure, a conductive bonding layer 31 is formed (FIG. 2(e)).

As the supporting substrate 30, any substrate having a sufficient mechanical strength, and a high thermal conductivity can be used, and the electric conductivity thereof may be optional. For example, a single crystal silicon (Si) substrate, which is a type of semiconductor substrate can be used. The conductive bonding layer 31 is formed of a conductive material which can be bonded with the bonding layer 24 and the bonding layer 26 by heat pressing, and as the bonding layer, Ti/Pt/Au/Sn/Au (100 Å/2000 Å/1000 Å/2000 Å/1 μm) is deposited, for example.

Figure 2F:
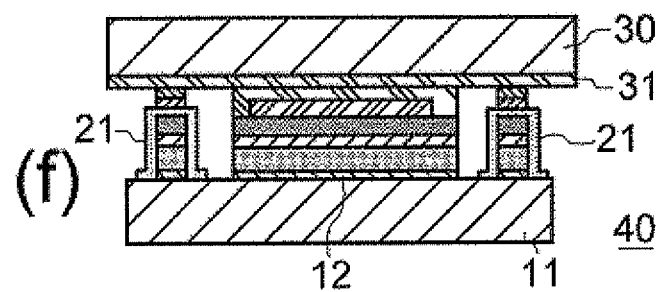

In the bonding step (step S18), the compound semiconductor layer 15 and the columnar member 21 are bonded to the supporting substrate 30 (FIG. 2(f)).

As shown in FIG. 2(f) the structure in FIG. 2(d) and the structure in FIG. 2(e) are press-bonded at a high temperature such that the conductive bonding layer 31 is directly contacted with the bonding layer 24, 26. They are bonded by heat pressing under a load of 12 kN at 300° C. for 60 minutes in the vacuum atmosphere, for example. By this step, the laminate 15a and the columnar member 21 are bonded to the supporting substrate 30 through the p-side electrode 25 and bonding layer 26, the sacrificing layer 23 and bonding layer 24, and the conductive bonding layer 31.

In the peeling-off step (step S19), the lift-off layer (metal buffer layer) 12 is removed to peel off the growth substrate 11. This peeling-off step is comprised of a lift-off step (step S191) and a sacrificing layer etching step (step S192). In the lift-off step (step S191), the columnar member 21 is kept bonded (FIG. 2(g)).

Figure 2G:
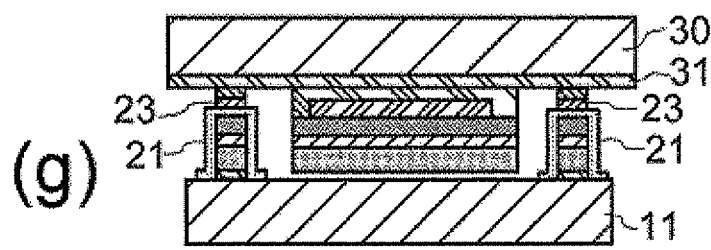
Figure 2H:
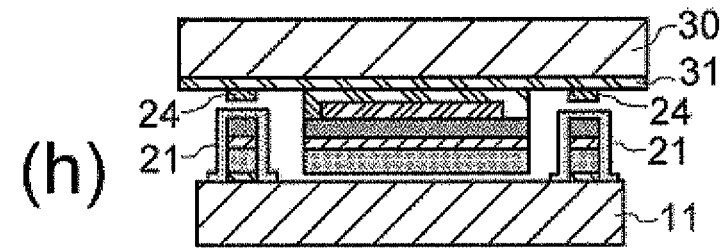

In the lift-off step (step S191), the bonded substrate 40 is soaked in, for example, hydrochloric acid for performing chemical etching to dissolve the lift-off layer (metal buffer layer) 12 (FIG. 2(g)). In the sacrificing layer etching step (step S192), a Cr selective etching fluid (cerium ammonium nitrate), for example, is used for performing chemical etching to dissolve the sacrificing layer 23 for peeling off the sapphire substrate 11.

In this lift-off step (step S191) in the peeling-off step, since the columnar member 21 is kept bonded, the stress imposed on the compound semiconductor layer 15a is alleviated, whereby the compound semiconductor layer (device region) 15a can be peeled off from the sapphire substrate 11 without cracks being initiated.

Therefore, after this peeling-off step, through then-side electrode formation step (step S20) and the wire bonding step (step S21), a high-quality LED (semiconductor device) with no cracks can be finally manufactured.

Figure 3:
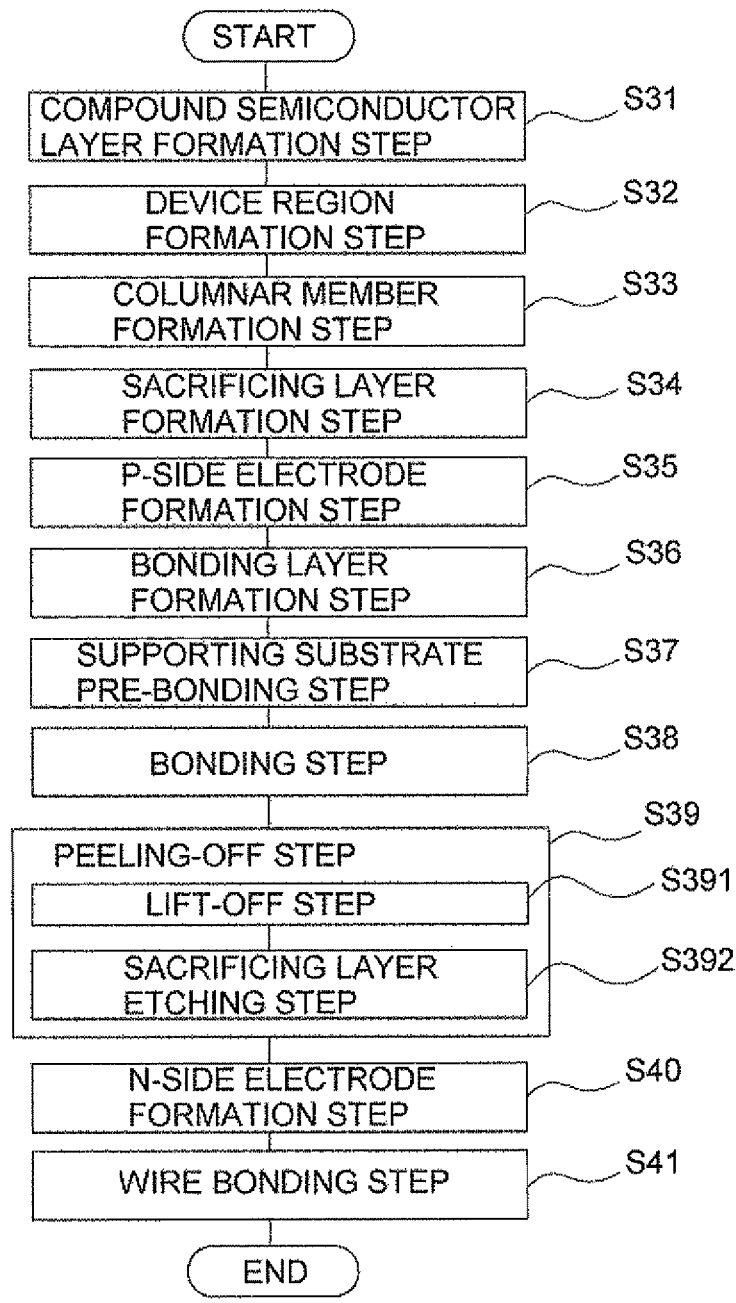
FIG. 3 is a flowchart showing the steps of manufacturing a semiconductor device by a manufacturing method therefor according to the second embodiment of the present invention.

FIG. 3 is a flowchart showing the steps of manufacturing a semiconductor device by a manufacturing method therefor according to the second embodiment of the present invention. FIG. 4 is a sectional view of a substrate in the respective steps of the method for manufacturing a semiconductor device according to the second embodiment of the present invention. In this second embodiment, after formation of a separation groove, a columnar member is formed on the growth substrate with no lift-off layer being provided. And, preferably, the columnar member is formed of a metal or resin. More preferably, the columnar member is formed of a metal or resin which will not be chemically etched in the lift-off step.

The method of manufacturing a semiconductor device according to the second embodiment has a compound semiconductor layer formation step (step S31), a device region formation step (step S32), a columnar member formation step (step S33), a sacrificing layer formation step (step S34), a p-side electrode formation step (step S35), a bonding layer formation step (step S35), a supporting substrate pre-bonding step (step S37), a bonding step (step S38), a peeling-off step (step S39), an n-side electrode formation step (step S40), and a wire bonding step (step S41), the peeling-off step (step S39) being comprised of a lift-off step (step S391) and a sacrificing layer etching step (step S392), and in the lift-off step (step S391) in the peeling-off step (step S39), the columnar member being kept bonded. In other words, in the lift-off step (step S391), the bottom face of the semiconductor layer and the growth substrate are separated from each other by removing the lift-off layer, and the columnar member will not be separated from the growth substrate.

Figure 4A:
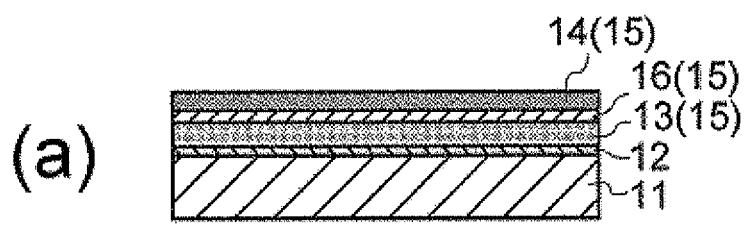
FIG. 4 is a sectional view of a substrate for one device in the respective steps of the method for manufacturing a semiconductor device according to the second embodiment of the present invention.

In the compound semiconductor layer formation step (step S31), a lift-off layer (metal buffer layer) is formed on the growth substrate, and a compound semiconductor layer is formed on the lift-off layer (FIG. 4(a)). Since this step is the same as the step S11, explanation will be omitted.

Figure 4B:
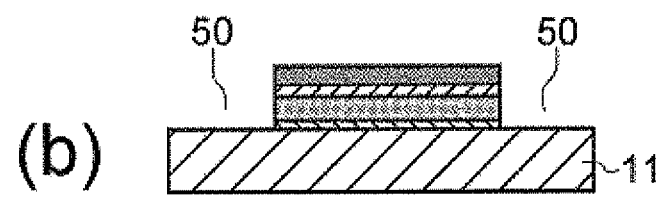
Figure 4C:
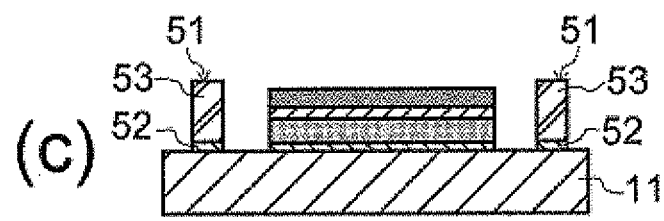

In the device region formation step (step S32), at least a part of the compound semiconductor layer (laminate) 15 is removed by etching to form a device region and a separation groove 50 (FIG. 4(b)). This step is the same as the step S12 in the first embodiment, except for no core member being formed around the device region, explanation will be omitted.

In the columnar member formation step (step S33), in a portion of the region of the separation groove 50, a columnar member 51 having substantially the same height as that of the device region is formed around the device region. For the columnar member 51, a seed layer 52 is first formed in a portion of the region of the separation groove, and a strut 53 is formed by Ni plating, or the like. The columnar member 51 is formed of the seed layer 52 and the strut 53 (FIG. 4(c)). The strut 53 may be formed by using a photo-resist which will not be etched by a metal etching fluid to be used in a subsequent step, instead of Ni plating.

Figure 4D:
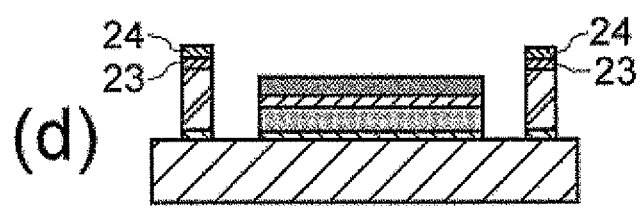

In the sacrificing layer formation step (step S34), as a sacrificing layer 23 and a bonding layer 24, Cr/Pt/Au (250 Å/2000 Å/1 μm), for example, is deposited on the top of the columnar member 51 (FIG. 4(d)). This step is the same as the step S14 in the first embodiment.

In the p-side electrode formation step (step S35), which is the same as the step 15 in the first embodiment, on the entire face of the p-type layer 14 located at the uppermost face, a material which can make an ohmic contact with the p-type layer 14 is deposited as a p-side electrode 25. For example, Ni/Au (50 Å/200 Å) is deposited and annealed.

Figure 4E:
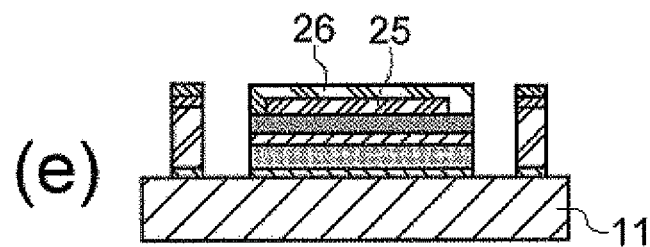

In the bonding layer formation step (step S36), which is the same as the step 16 in the first embodiment, Pt/Au (2000 Å/2 μm), for example, is deposited as a bonding layer 26 (FIG. 4(e)).

In the supporting substrate pre-bonding step (step S37), on one main face of a supporting substrate 30, which has been prepared besides the aforementioned structure, a conductive bonding layer 31 is formed. In the steps subsequent to this step, since the same operations as those in the step S17 to step S21 in the first embodiment are performed, the sectional views and specific explanations will be omitted.

In the bonding step (step S38), the compound semiconductor layer 15 and the columnar member 51 are bonded to the supporting substrate 30.

In the peeling-off step (step S39), the lift-off layer (metal buffer layer) 12 is removed to peel off the growth substrate 11. This peeling-off step is comprised of a lift-off step (step S391) and a sacrificing layer etching step (step S392). In the lift-off step (step S391), the columnar member 51 is kept bonded.

In the lift-off step (step S391), the bonded substrate 40 is soaked in, for example, hydrochloric acid for performing chemical etching to dissolve the lift-off layer (metal buffer layer) 12. In the sacrificing layer etching step (step S392), a Cr selective etching fluid (cerium ammonium nitrate), for example, is used for performing chemical etching to dissolve the sacrificing layer 23 for peeling off the sapphire substrate 11.

In this lift-off step (step S391) in the peeling-off step, since the columnar member 51 is kept bonded, the stress imposed on the compound semiconductor layer 15a is alleviated, whereby the compound semiconductor layer (device region) 15a can be peeled off from the sapphire substrate 11 without cracks being initiated.

Therefore, after this peeling-off step, through then-side electrode formation step (step S40) and the wire bonding step (step S41), a high-quality LED (semiconductor device) with no cracks can be finally manufactured.

Figure 5:
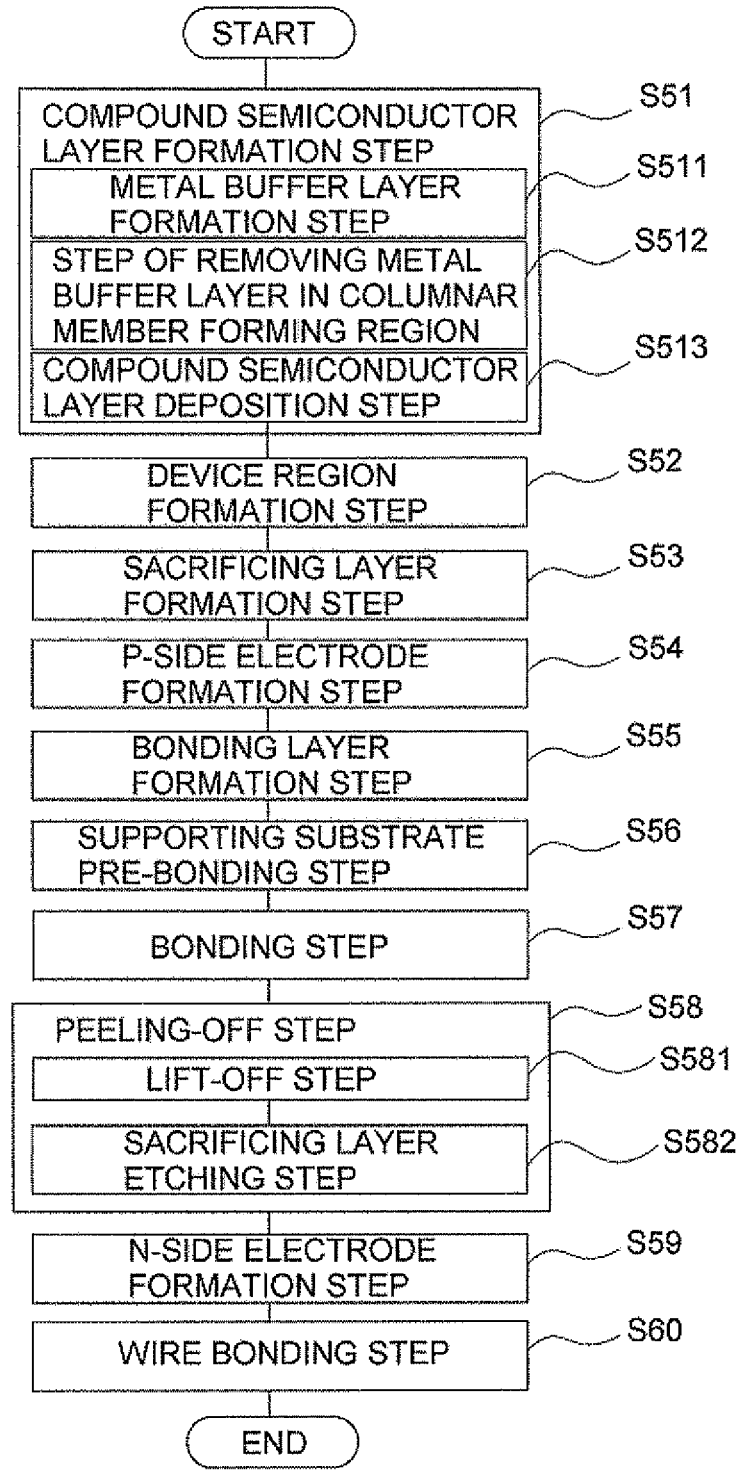
FIG. 5 is a flowchart showing the steps of manufacturing a semiconductor device by a manufacturing method therefor according to the third embodiment of the present invention.

FIG. 5 is a flowchart showing the steps of manufacturing a semiconductor device by a manufacturing method therefor according to the third embodiment of the present invention. FIG. 6 is a sectional view of a substrate in the respective steps of the method for manufacturing a semiconductor device according to the third embodiment of the present invention. This third embodiment features that, in the compound semiconductor layer formation step, there are provided a step of forming a metal buffer layer and a step of removing the metal buffer layer in the region where a columnar member (core member) is to be provided, which is followed by a step of forming a compound semiconductor layer.

The method of manufacturing a semiconductor device according to the third embodiment has a compound semiconductor layer formation step (step S51), a device region formation step (step S52), a sacrificing layer formation step (step S53), p-side electrode formation step (step S54), a bonding layer formation step (step S55), a supporting substrate pre-bonding step (step S56), a bonding step (step S57), a peeling-off step (step S58), an n-side electrode formation step (step S59), and a wire bonding step (step S60), the peeling-off step (step S58) being comprised of a lift-off step (step S581) and a sacrificing layer etching step (step S582), and in the lift-off step (step S581) in the peeling-off step (step S58), the columnar member being kept bonded. In other words, in the lift-off step (step S191), the bottom face of the semiconductor layer and the growth substrate are separated from each other by removing the lift-off layer, and the columnar member will not be separated from the growth substrate. In addition, the compound semiconductor layer formation step (step S51) has a metal buffer layer formation step (step S511), a step of removing the metal buffer layer in the region where a columnar member (core member) is to be formed (step S512), and a compound semiconductor layer deposition step (step S513).

Figure 6A:
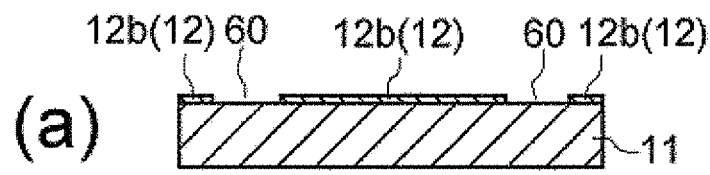
FIG. 6 is a sectional view of a substrate for one device in the respective steps of the method for manufacturing a semiconductor device according to the third embodiment of the present invention.

In the compound semiconductor layer formation step (step S51), a selectively formed metal buffer layer is used. First, a step of forming a metal buffer layer (step S511) is performed. In this step, a lift-off layer (metal buffer layer) is formed on the growth substrate. First, as shown in FIG. 6(a), a metal buffer layer 12 is formed on a growth substrate 11. As the growth substrate 11, a sapphire single crystal ((0001) substrate) is particularly preferably used. As a metal buffer layer 12 thereon, scandium (Sc) having a film thickness of 100 Å, for example, or so can be used. Film formation of the metal buffer layer 12 can be performed by the sputtering method, the vacuum deposition method, or the like.

Next, a step of removing the metal buffer layer in the region where a columnar member (core member) is to be formed (step S512) is performed. Thereby, as shown in FIG. 6(a), a region 12b where the metal buffer layer has been deposited on the growth substrate 11, and a region 60 where the same has not been deposited are provided. The lifting-off method or the etching method can be used with a photo-resist, or the like, being used as a mask.

Next, in this state, a step of nitridation treatment is performed in an ammonia atmosphere at a high temperature of 1040° C. or over, for example. Thereby, the surface of the metal buffer layer (metal layer: Sc layer) 12 is nitrided to be a scandium nitride layer (metal nitride layer: ScN layer) 12s. The thickness of this ScN layer 12s can be set by adjusting the treatment time, the temperature, and the like.

In the compound semiconductor layer deposition step (step S513), on a region 12b where the Sc metal buffer layer 12 having a ScN layer 12s has been deposited, and a region 60 where the same has not been deposited, an n-type nitride semiconductor layer (n-type semiconductor layer: n-type layer) 13, and a p-type nitride semiconductor layer (p-type semiconductor layer: p-type layer) 14 are sequentially deposited (epitaxial growth step). This film formation is performed by, for example, the metal organic chemical vapor deposition process (MOCVD process), an impurity serving as a donor being doped into the n-type layer 13, while an impurity serving as an acceptor into the p-type layer 14. By this epitaxial growth step, a laminate 15 comprised of an n-type layer 13 and a p-type layer 14 is formed, and therein a pn junction of a nitride semiconductor is formed to be a light-emitting layer 16. On the ScN layer 12s, an n-type layer 13 and a p-type layer 14 with less crystal defects can be grown. Accordingly, the nitride semiconductor in this laminate 15 can be of high quality, whereby the light emitting intensity can be enhanced.

Figure 6B:
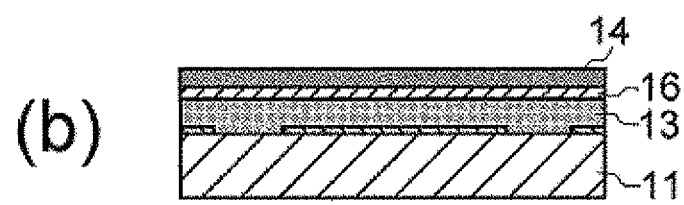

In the device region formation step (step S52), at least a part of the compound semiconductor layer (laminate) 15 is removed by etching to form a device region and a separation groove 61 concurrently (FIG. 6(b)). When the device region is formed, a columnar member (core member) 62 for bonding the growth substrate 11 and the supporting substrate to each other is left. This columnar member (core member) 62 is formed of a compound semiconductor layer (laminate) which has been deposited in the region 60 where the metal buffer layer has not been deposited.

Formation of the separation groove 61 is performed in the following way, for example. $SiO_2$ is deposited on the compound semiconductor layer 15 by the CVD process; a photoresist is used to perform patterning; and etching is performed with BHF to form a mask of $SiO_2$. Thereafter, using $SiO_2$ as a mask, the compound semiconductor layer is dry-etched until the sapphire substrate is exposed. Thereafter, BHF is used to remove the $SiO_2$ mask.

Figure 6C:
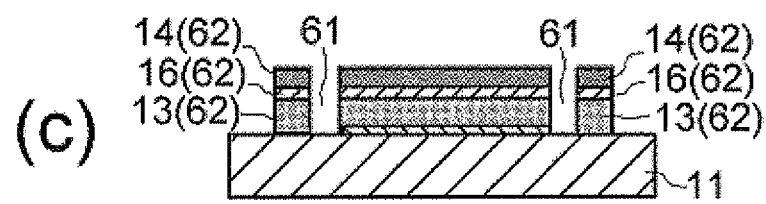
Figure 6D:
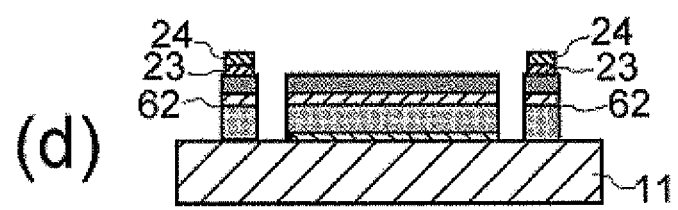

In the sacrificing layer formation step (step S53), as a sacrificing layer 23 and a bonding layer 24, Cr/Pt/Au (250 Å/2000 Å/1 μm) is deposited on the top of the columnar member (core member) 62 (FIG. 6(d)). This step is the same as the step S14 in the first embodiment.

In the p-side electrode formation step (step S54), which is the same as the step 15 in the first embodiment, on the entire face of the p-type layer 14 located at the uppermost face, a material which can make an ohmic contact with the p-type layer 14 is deposited as a p-side electrode 25. For example, Ni/Au (50 Å/200 Å) is deposited and annealed.

Figure 6E:
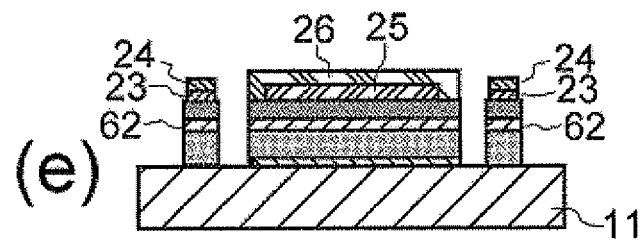

In the bonding layer formation step (step S55), as in the step 16 in the first embodiment, Pt/Au (2000 Å/2 μm) is deposited as a bonding layer 26 (FIG. 6(e)).

In the supporting substrate pre-bonding step (step S56), on one main face of a supporting substrate 30, which has been prepared besides the aforementioned structure, a conductive bonding layer 31 is formed. In the steps subsequent to this step, since the same operations as those in the step S17 to step S21 in the first embodiment are performed, the sectional views and specific explanations will be omitted.

In the bonding step (step S57), the compound semiconductor layer 15 and the columnar member 62 are bonded to the supporting substrate 30.

In the peeling-off step (step S58), the lift-off layer (metal buffer layer) 12 is removed to peel off the growth substrate 11. This peeling-off step is comprised of a lift-off step (step S581) and a sacrificing layer etching step (step S582). In the lift-off step (step S581), the columnar member (core member) 62 is kept bonded.

In the lift-off step (step S581), the bonded substrate 40 is soaked in, for example, hydrochloric acid for performing chemical etching to dissolve the metal buffer layer 12. In the sacrificing layer etching step (step S392), a Cr selective etching fluid (cerium ammonium nitrate), for example, is used for performing chemical etching to dissolve the sacrificing layer 23 for peeling off the sapphire substrate 11.

In this lift-off step (step S581) in the peeling-off step, since the columnar member 62 is kept bonded, the stress imposed on the compound semiconductor layer 15a is alleviated, whereby the compound semiconductor layer (device region) 15a can be peeled off from the sapphire substrate 11 without cracks being initiated.

Therefore, after this peeling-off step, through then-side electrode formation step (step S59) and the wire bonding step (step S60), a high-quality LED (semiconductor device) with no cracks can be finally manufactured.

In addition, the pattern of the metal buffer layer (metal layer: Sc layer) 12 in the compound semiconductor layer formation step (step S51) and the pattern of the columnar member (core member) 62 in the device region formation step (step S52) may be different from the example in FIG. 6. FIG. 7 is a step cross-sectional view illustrating the manufacturing steps in this case. FIGS. 7(a) to 7(e) correspond to FIGS. 6(a) to 7(e), and only the positional relationship between the pattern of the Sc layer 12b and that of the columnar member 62 is different. Herein, instead of the step of removing the metal buffer layer in the region where the columnar member (core member) is to be formed (the step S512) in FIG. 5, a step of removing the metal buffer layer (Sc layer 12) in the region other than that where the metal buffer layer is to be left, i.e., the device region and the region the inside of which the columnar member 62 is to be formed is performed.

Figure 7A:
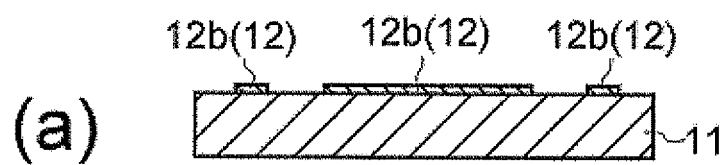
FIG. 7 is a sectional view of a substrate for one device in the respective steps of another modification of the method for manufacturing a semiconductor device according to the third embodiment of the present invention.
Figure 7B:
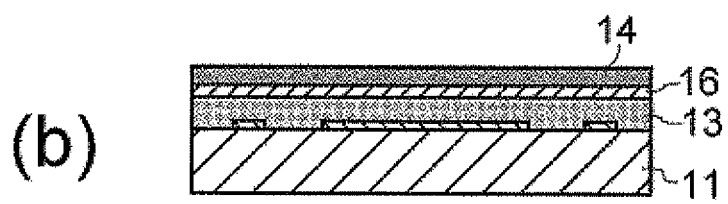
Figure 7C:
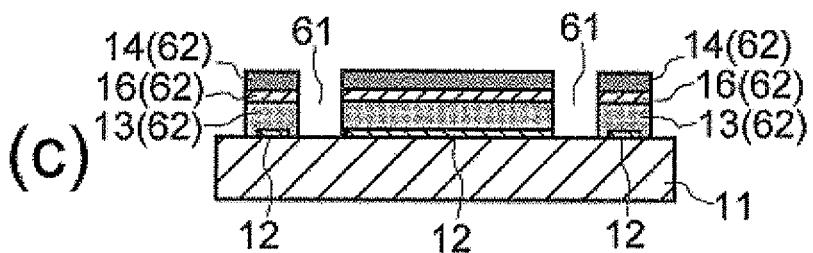
Figure 7D:
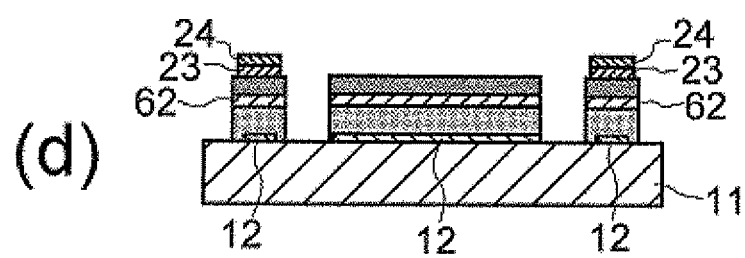
Figure 7E:
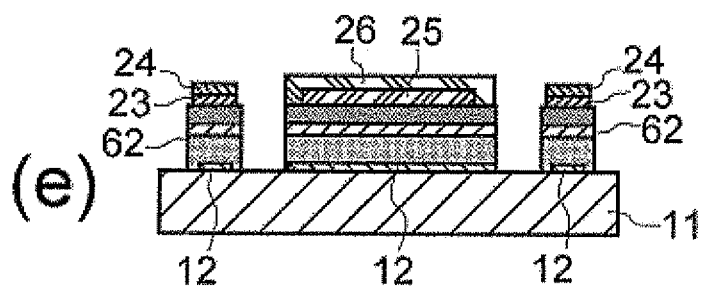

In FIG. 7(c), as is the case with FIG. 6(c), the columnar member 62 is formed by etching. In FIG. 6, the Sc layer 12 (12b) is not formed in a place where the columnar member 62 is to be formed, while, herein, the Sc layer 12 (12b) is set so as to be formed inside of the columnar member 62. In other words, the Sc layer 12 inside of the columnar member 62 is set such that it is not exposed from the n-type layer 13. Setting the columnar member 62 and the Sc layer 12 in this way can be performed in the same manner as in FIG. 6.

In this case, since the Sc layer 12 inside of the columnar member 62 is set such that it is not exposed from the n-type layer 13, even in the lift-off step, the Sc layer 12 inside of the columnar member 62 will not be etched, the columnar member 62 and the growth substrate 11 being kept bonded to each other. Therefore, the subsequent steps can be performed in the same way as with the manufacturing method in FIG. 6. In this case, contrarily to the manufacturing method in FIG. 6, the height in the device region is equivalent to that of the columnar member 62 in the state of FIG. 7(c). Accordingly, the height adjustment of these, which is important in the bonding step, can be particularly easily made. In addition, the Sc layer 12 inside of the columnar member 62 can also be used as an alignment mark in the lithography and bonding.

Figure 8:
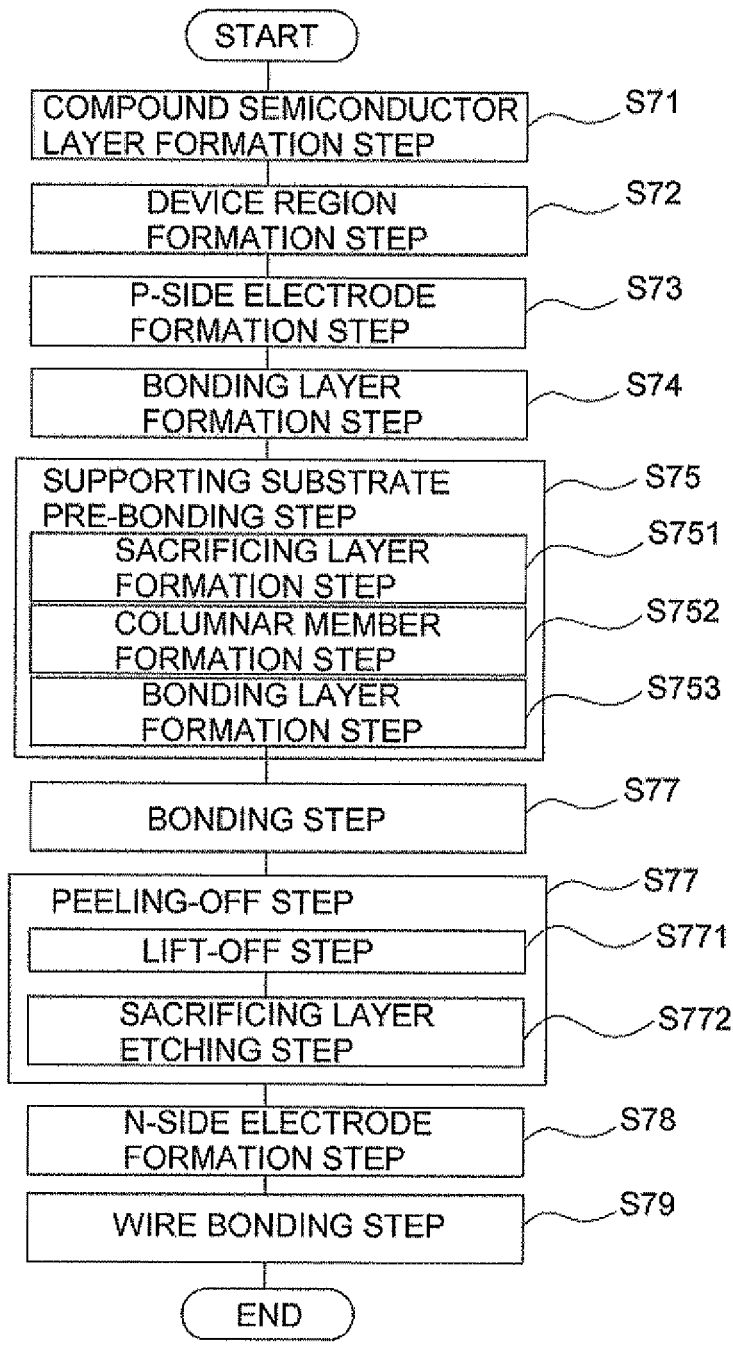
FIG. 8 is a flowchart showing the steps of manufacturing a semiconductor device by a manufacturing method therefor according to the fourth embodiment of the present invention.

FIG. 8 is a flowchart showing the steps of manufacturing a semiconductor device by a manufacturing method therefor according to the fourth embodiment of the present invention. FIG. 9 is a sectional view of a substrate in the respective steps of the method for manufacturing a semiconductor device according to the fourth embodiment of the present invention. In this fourth embodiment, a sacrificing layer is formed on a supporting substrate, and using the sacrificing layer as a base, a columnar member is formed. And, preferably, the columnar member is formed of a metal. More preferably, the columnar member is formed of a metal which will not be chemically etched.

The method of manufacturing a semiconductor device according to the fourth embodiment has a compound semiconductor layer formation step (step S71), a device region formation step (step S72), a p-side electrode formation step (step S73), a bonding layer formation step (step S74), a supporting substrate pre-bonding step (step S75), a bonding step (step S76), a peeling-off step (step S77), an n-side electrode formation step (step S78), and a wire bonding step (step S79). And, the supporting substrate pre-bonding step (step S75) has a sacrificing layer formation step (step S751), a columnar member formation step (step S752), and a bonding layer formation step (step S753). In addition, the peeling-off step (step S77) is comprised of a lift-off step (step S771) and a sacrificing layer etching step (step S772), and in the lift-off step (step S771) in the peeling-off step (step S77), the columnar member is kept bonded. In other words, in the lift-off step (step S771), the bottom face of the semiconductor layer and the growth substrate are separated from each other by removing the lift-off layer, and the columnar member will not be separated from the growth substrate.

In the compound semiconductor layer formation step (step S71), a lift-off layer (metal buffer layer) and a compound semiconductor layer on the lift-off layer are formed on a growth substrate 11. Since this step is the same as the step S11 in the first embodiment, explanation will be omitted.

In the device region formation step (step S72), at least a part of the compound semiconductor layer (laminate) 15 is removed by etching to form a device region and a separation groove 50. This step is the same as the step S12 in the first embodiment, except for no core member being formed around the device region, explanation will be omitted.

In the p-side electrode formation step (step S73), which is the same as the step 15 in the first embodiment, on the entire face of the p-type layer 14 located at the uppermost face, a material which can make an ohmic contact with the p-type layer 14 is deposited as a p-side electrode 25. For example, Ni/Au (50 Å/200 Å) is deposited and annealed.

Figure 9A:
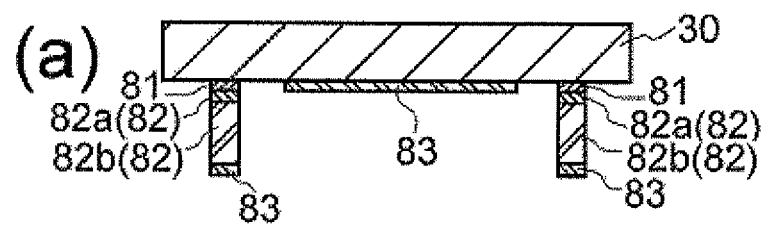
FIG. 9 is a sectional view of a substrate for one device in the respective steps of the method for manufacturing a semiconductor device according to the fourth embodiment of the present invention.
Figure 9B:
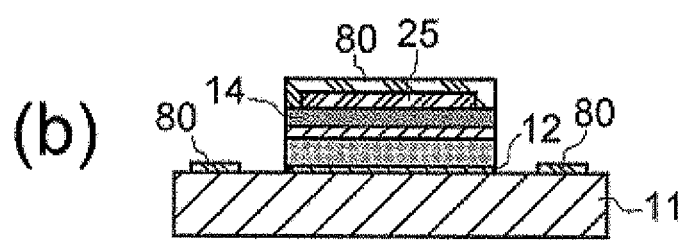

In the bonding layer formation step (step S74), as in the step S16 in the first embodiment, Pt/Au (2000 Å/2 μm) is deposited as a bonding layer 80 (FIG. 9(b)).

In the supporting substrate pre-bonding step (step S75), the sacrificing layer formation step (step S751) is first performed. In the sacrificing layer formation step (step S751), on one main face of a supporting substrate 30, which has been prepared besides the aforementioned structure, Cr (250 Å) is deposited as a sacrificing layer 81. In FIG. 9(a), the supporting substrate 30 is shown, being directed downward.

In the columnar member formation step (step S752), using the sacrificing layer 81 formed on the supporting substrate 30 as a base, a columnar member 82, which has substantially the same height as that of the device region formed on the growth substrate 11, is formed. For the columnar member 82, a seed layer 82a is first formed, and a strut 82b is formed by Ni plating, or the like. The columnar member 82 is formed of the seed layer 82a and the strut 82b (FIG. 9(a)). The strut 82b may be formed by using a photo-resist which will not be etched by a metal etching fluid to be used in a subsequent step, instead of Ni plating.

In the bonding layer formation step (step S753), on the supporting substrate 30 and on the columnar member 82, Pt/Au (2000 Å/2 μm) is deposited as a bonding layer 83 (FIG. 9(a)).

Figure 9C:
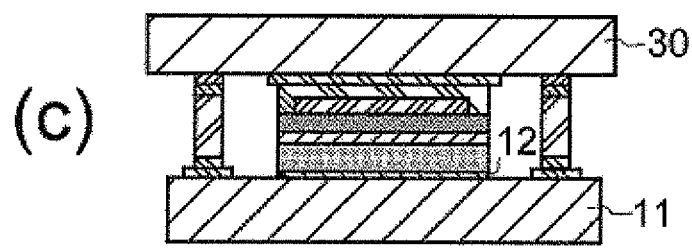
Figure 9D:
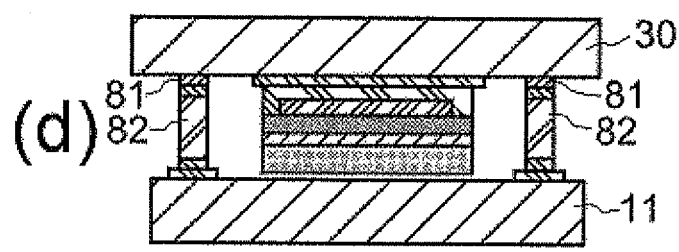
Figure 9E:
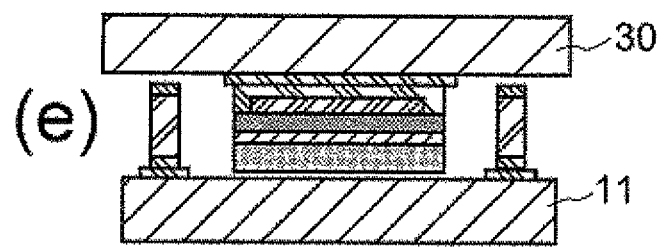

In the bonding step (step S76), by bonding the bonding layer 80 shown in FIG. 9(b) and the bonding layer 83 shown in FIG. 9(a) to each other, the compound semiconductor layer 15 and the supporting substrate 30 are bonded to each other, the columnar member 82 and the growth substrate 11 being bonded to each other (FIG. 9(c)).

In the peeling-off step (step S77), the lift-off layer (metal buffer layer) 12 is removed to peel off the growth substrate 11. This peeling-off step is comprised of a lift-off step (step S771) and a sacrificing layer etching step (step S772). In the lift-off step (step S771), the columnar member 82 is kept bonded (FIG. 9(d)).

In the lift-off step (step S771), the bonded substrate 40 is soaked in, for example, hydrochloric acid for performing chemical etching to dissolve the metal buffer layer 12. In the sacrificing layer etching step (step S772), a Cr selective etching fluid (cerium ammonium nitrate), for example, is used for performing chemical etching to dissolve the sacrificing layer 81 for peeling off the sapphire substrate 11.

In this lift-off step (step S771) in the peeling-off step, since the columnar member 82 is kept bonded, the stress imposed on the compound semiconductor layer 15a is alleviated, whereby the compound semiconductor layer (device region) 15a can be peeled off from the sapphire substrate 11 without cracks being initiated.

Therefore, after this peeling-off step, through then-side electrode formation step (step S78) and the wire bonding step (step S79), a high-quality LED (semiconductor device) with no cracks can be finally manufactured.

In the aforementioned embodiments, sapphire has been used as a growth substrate 11 for explanation, however, as the growth substrate 11, any material other than sapphire, such as an AlN template, SiC, or the like, can be used, provided that it allows a group III nitride semiconductor, such as good-quality GaN, AlGaN, or the like, (for the n-type layer 13 and the p-type layer 14) to be grown through the buffer layer 12, or the like.

In addition, as the supporting substrate 30, any material other than silicon can be used. However, since the supporting substrate 30 serves not only as a mechanical supporting substrate for a manufactured LED, but also as a heat-sink substrate, it is preferable that the supporting substrate 30 have a high mechanical strength and a high thermal conductivity. The material of the supporting substrate 30 can be selected from a wide range of materials, and various insulative substrates, metal substrates, and semiconductor substrates can be used. In addition, a metal/ceramic bonding substrate with which a metal wiring has been previously formed on an insulative ceramic substrate, having a high mechanical strength and thermal conductivity, can be used.

In the aforementioned examples, the laminate has been assumed that it is constituted by an n-type layer 13 and a p-type layer 14 which are both composed of a nitride semiconductor. However, it is obvious that, in any case other than this, the same advantages are offered. For example, it is obvious that, instead of an LED utilizing a simple pn junction, an LED having a structure providing a multiple quantum well structure serving as an active layer between the n-type layer and p-type layer, and an LD (laser diode) may be manufactured as well. In this case, in the epitaxial growth step, the n-type layer 13 is formed on the growth substrate 11, and an active layer is formed thereon before the p-type layer 14 being formed.

If, for example, the growth substrate is compared to the floor, while the supporting substrate is to the ceiling, the columnar member in the aforementioned embodiments temporarily plays a role of pillar between the floor and the ceiling, and it is not limited to a substantially circular pillar, a polygonal pillar, and the like, the geometry, size and positional relationship being allowed to be various. However, in the case where chemical etching is selected among the several lifting-off methods, a design which, like a wall surrounding all four sides, for example, completely blocks up the path allowing the etching fluid for chemical etching to reach the lift-off layer should not be adopted. It is preferable that the layout have a regularity for uniformly distributing the stress on the geometry of the portion to be lifted-off.

The columnar member in the aforementioned embodiments is required to be peeled off after the lifting-off. In order to facilitate the peeling-off, it is preferable to provide a sacrificing layer in a portion of the columnar member, however, it is also preferable that the columnar member itself also serve as a sacrificing layer. In addition, in the aforementioned embodiments, the columnar member peeling place is specified to be on the supporting substrate side in order to avoid adverse effects in separating the devices individually, however, the peeling place may be on the growth substrate side, the location being optional. For the purpose of reuse of the substrate, the columnar member may be peeled off on either side.

The sacrificing layer in the aforementioned embodiments is not peeled off when the lift-off layer is lifted-off, however, in the subsequent sacrificing layer etching step, the sacrificing layer must be able to be separated without having an adverse effect on the device and the bonding layer. In the case of chemical lift-off, it is necessary that different selective etching fluids be prepared for the metal buffer layer and sacrificing layer which are lift-off layers. As the metal buffer layer, the material can be selected from Sc, Cr, Zr, Hf, and the like (and the nitrides thereof), for example. As the sacrificing layer, the material can be selected from those other than that selected for the metal buffer layer; they are, for example, metals such as Cr, Ni Ti, and the like, resins, adhesives, and the like. The method for separating the sacrificing layer is not limited to etching, and may be a method using heat, light, a mechanical means, or the like. As the bonding layer, any material other than that selected for the aforementioned layers, and, for example, a precious metal, such as Pt, Au, or the like, may be used. Depending upon the type of the lift-off layer, and depending upon the type of the selective etching fluid and the separating method, there can be a variety of combinations of these materials.

It is relatively preferable that, like the columnar member in the first and third of the first to fourth embodiments, the columnar member have a core member formed of the same material as that of the semiconductor layer. As compared to the columnar member in the second and fourth embodiments, which is formed of a material different from that of the semiconductor layer, the quality control can be made easily for an accuracy of height adjustment to the semiconductor layer, which is required at the time of bonding with the supporting substrate.

Example 1-1

Actually, in the step exemplified in the first embodiment, a compound semi conductor layer was formed, and sapphire substrate peeling was carried out. On the (0001) face of a sapphire single crystal substrate, scandium (Sc) was deposited by the sputtering method to a film thickness of 100 Å as a metal buffer layer. Next, in the ammonia atmosphere, nitridation treatment was performed at 1200° C. for 10 minutes, thereby the metal buffer layer was nitrided, a scandium nitride layer (ScN layer) being formed.

Next, on the ScN layer, non-doped AlGaN of 2 μm, a Si-doped n-type AlGaN layer (1.5 μm), an MQW active layer (0.1 μm), and a Mg-doped p-type AlGaN layer (0.3 μm) were sequentially deposited by the MOCVD process.

$SiO_2$ was deposited on the p-type AlGaN layer by the CVD process; a photo-resist was used for patterning; with BHF, etching was performed to form a $SiO_2$ mask; and the compound semiconductor layer was dry-etched until the sapphire substrate was exposed. Thereafter, BHF was used to remove the $SiO_2$ mask; a circular device region having a diameter of 850 μm was formed; and a core member having a diameter of approx. 90 μm was formed around the device region.

As a protection film, $SiO_2$ (1 μm) was deposited by the CVD process such that the entire core member was covered.

On the protection film at the top of the core member, as a sacrificing layer, Cr (250 Å) was deposited, and as a bonding layer, Pt/Au (2000 Å/1 μm) was deposited.

In addition, on the entire face of the p-type layer in the device region, as a p-side electrode, Ni/Au (50 Å/200 Å) was deposited, and annealed at 550° C. for 15 minutes. Thereafter, as a bonding layer, Pt/Au (2000 Å/2 μm) was deposited.

As a supporting substrate 30, a p-type single crystal silicon (Si) substrate was used, and a bonding layer on the supporting substrate side, Ti/Pt/Au/Sn/Au (100 Å/2000 Å/1000 Å/2000 Å/1 μm) was deposited. The bonding layer on the side of the device region and columnar member, and the bonding layer of the supporting substrate side were heat-pressed under a load of 12 kN at 300° C. for 60 minutes in the vacuum atmosphere.

The bonded substrate was soaked in hydrochloric acid for 24 hr to dissolve Sc and ScN for chemical lifting-off. Thereafter, a Cr selective etching fluid (cerium ammonium nitrate) was used for dissolving the sacrificing layer to peel off the sapphire substrate.

The quality of the compound semiconductor layer after the sapphire substrate peeling was compared with that obtained by the conventional manufacturing method by observing the surface thereof with an optical microscope.

Figure 10A:
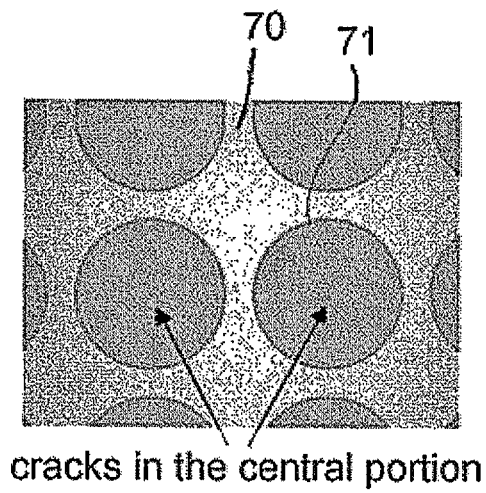
FIG. 10 is a figure showing a compound semiconductor layer after sapphire substrate peeling, (a) being by a conventional manufacturing method, (b) being by the manufacturing method of the present invention, and (c) being an electron microscope photograph.
Figure 10B:
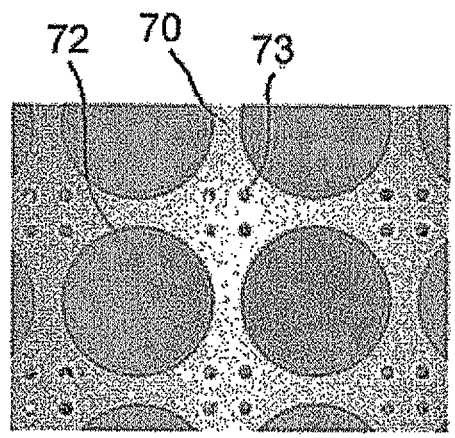
Figure 10C:
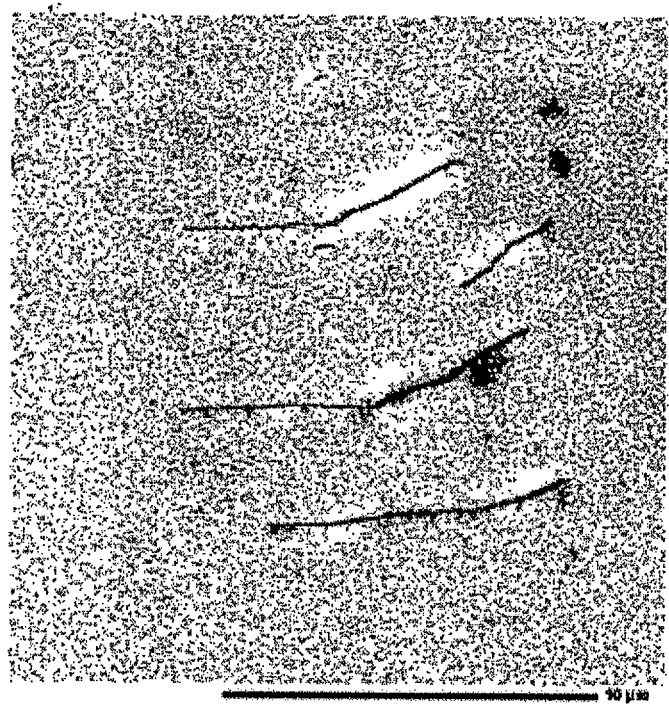

Herein, with the conventional manufacturing method, which was used as a comparative method, the sapphire substrate peeling was performed without any columnar members being provided around the device region. FIG. 10(a) is a figure showing the supporting substrate and the compound semiconductor layer as a result of peeling off the sapphire substrate without any core member being formed and any columnar member being provided, FIG. 10(b) is a figure showing the supporting substrate and the compound semiconductor layer as a result of providing a columnar member in Example 1-1 for peeling off the sapphire substrate, and thereafter separating the columnar member. In the present Example, uniformly for the semiconductor layers of the respective devices, columnar members of circular cylinder having a diameter of approx. 90 μm were disposed in the locations of the apexes of a square having one side of 850 μm such that they surround the circular semiconductor layer having a diameter of 850 μm. A section of one device when viewed from the side of the diagonal line of this square is exemplified in the sectional view for the first to fourth embodiments. The reference numeral 70 in FIG. 10 denotes the supporting substrate; the reference numeral 71 the compound semiconductor layer with the conventional method; and the reference numeral 72 the compound semiconductor layer with the present invention. Further, the reference numeral 73 in FIG. 10(b) denotes a mark given by peeling off the columnar member (the face of the bonding layer 24 on the side of the sacrificing layer 23). As shown in FIG. 10(a) and an electron microscope photograph (FIG. 10(c)), it was observed by the metallurgical microscope and the SEM that, with the conventional manufacturing method, there initiated cracks in the central portion of the compound semiconductor layer after the sapphire substrate peeling. It can be supposed that the compound semiconductor layer was etched from the circumferential portion, and in a miniature region left in the central portion just before the sapphire substrate was peeled off, there occurred a stress concentration between the substrate and compound semiconductor layer and the supporting substrate, thereby after the peeling, such cracks were observed. However, as can be seen from FIG. 10(b), with the manufacturing method of the present invention, no cracks were initiated in the compound semi conductor layer. With the manufacturing method of the present invention, no cracks as shown in FIG. 10(c), for example, were observed with an electron microscope.

Therefore, it was verified that, in Example 1-1, no cracks will be caused at the time of sapphire substrate peeling, and in the compound semiconductor layer, which is to be lifted-off by etching the lift-off layer from the periphery, occurrence of cracks can be suppressed in a place where stresses would be concentrated as the etching is progressed.

Example 1-2

In Example 1-2, operations were carried out as in Example 1-1, except that, in the case where, in the step exemplified in the first embodiment, the sacrificing layer and bonding layer also serve as the protection layer, the formation step for the protection layer was omitted, and so as to cover the whole of the core member, Cr (250 Å) was deposited as the sacrificing layer; Pt/Au (2000 Å/1 μm) was deposited as the bonding layer; and the bonding layer of the device region was fabricated with Pt/Au (2000 Å/1 μm). The result obtained was the same as that in FIG. 10(b), no cracks being initiated in the compound semiconductor layer.

Example 2

In Example 2, operations were carried out as in Example 1-1, except that, as in the step exemplified in the second embodiment, the core member was not formed; Pt/Au/Pt/Pd (500 Å/7500 Å/500 Å/500 Å) was used as the seed layer; the columnar member was formed by Ni plating to a thickness of 3 μm; and the bonding layers of the columnar member and device region were fabricated with Pt/Au (2000 Å/1 μm). The result obtained was the same as that in FIG. 10(b), no cracks being initiated in the compound semiconductor layer.

Example 3

In Example 3, operations were carried out as in Example 1-1, except that, as in the step exemplified in the third embodiment, the metal buffer layer to be provided in the location of the core member was removed by forming a photo-resist mask and etching; and with no protection film being formed, the bonding layers of the columnar member and device region were fabricated with Pt/Au (2000 Å/1 μm). The result obtained was the same as that in FIG. 10(b), no cracks being initiated in the compound semiconductor layer.

Example 4

In Example 4, operations were carried out as in Example 2, except that, as in the step exemplified in the fourth embodiment, the peeling layer was formed on the supporting substrate through the columnar member. No marks as denoted by the reference numeral 73 in FIG. 10(b), which would have been given by peeling off the columnar member, were seen, no cracks being initiated in the compound semiconductor layer.

In addition, with the samples prepared in Example 1-1 and Comparative Example, the non-doped AlGaN layer in the peeled-off compound semiconductor layer was further dry-etched to be removed, and Ti/Al was formed on the exposed n-type AlGaN layer for making an I-V measurement. At a reverse voltage Vr (−10 μA), Example 1-1 exhibited over 10 V, while Comparative Example 1 as low as approx. 6 V. It can be supposed that occurrence of cracks increased the leakage current. Thus it has been found that, in accordance with the present invention, a device exhibiting a smaller leakage current can be obtained.

The structure, geometry, size and positional relationship as explained in the aforementioned embodiments have been only schematically given to such a degree that the present invention can be understood and implemented, and the numerical values and the composition (material), and the like, of each structure have been only exemplified. Therefore, the present invention is not limited to the embodiments which have been explained, and may be modified to various forms so long as there is no departure from the range of the technical concept as given in the scope of claim for patent.

INDUSTRIAL APPLICABILITY

The semiconductor device and the method for manufacturing a semiconductor device in accordance with the present invention are applicable to semiconductor devices, such as LED optical devices, and the like, and methods for manufacturing semiconductor devices.

DESCRIPTION OF SYMBOLS

11: Growth substrate
12: Lift-off layer (metal buffer layer) (metal layer: Sc layer)
13: N-type nitride semiconductor layer (n-type semiconductor layer: n-type layer)
14: P-type nitride semiconductor layer (p-type semiconductor layer: p-type layer)
15: Compound semiconductor layer (laminate)
15a: Device region
16: Light-emitting layer
20: Separation groove
21: Columnar member
22: Protection film
23: Sacrificing layer
24: Bonding layer
25: P-type electrode
26: Bonding layer
30: Supporting substrate
31: Conductive bonding layer

The invention claimed is:

1. A method for manufacturing a semiconductor device having a structure in which a semiconductor layer is bonded on a supporting substrate, comprising:
a device region formation step of forming a device region comprised of the semiconductor layer on a growth substrate through a lift-off layer;
a columnar member formation step of forming a columnar member on the growth substrate;
a bonding step of bonding the semiconductor layer and the columnar member to a supporting substrate;
a lift-off step of separating a bottom surface of the semiconductor layer from the growth substrate by removing the lift-off layer, and not separating the columnar member from the growth substrate; and
a step of separating the columnar member from the supporting substrate.

2. The method for manufacturing a semiconductor device of claim 1,
wherein the columnar member formation step has a sacrificing layer formation step of forming a sacrificing layer in a portion of the columnar member, and in the step of separating the columnar member and the supporting substrate, the sacrificing layer is removed.

3. The method for manufacturing a semiconductor device of claim 1,
wherein the columnar member has a core member formed of the same material as that of the semiconductor layer.

4. The method for manufacturing a semiconductor device of claim 3,
wherein, in the device region formation step, after a material constituting the semiconductor layer being formed on the growth substrate through the lift-off layer, etching is performed to form the device region and the core member; and
in the columnar member formation step, a protection layer which is not removed in the lift-off step is formed on the side face of the core member.

5. The method for manufacturing a semiconductor device of claim 3,
wherein the step of forming the lift-off layer on the growth substrate has a step of removing the lift-off layer in the region where the columnar member is to be formed, and after a material constituting the semiconductor layer being formed on the growth substrate through the lift-off layer, and partially being formed not through the lift-off layer, etching is performed to concurrently form the device region and the core member which is not lifted-off in the lift-off step.

6. The method for manufacturing a semiconductor device of claim 3,
wherein the step of forming the lift-off layer on the growth substrate has a step of selectively forming the lift-off layer in the device region and the region which is inside the region where the columnar member is to be formed, and after a material constituting the semiconductor layer being formed on the growth substrate through the lift-off layer, and partially being formed not through the lift-off layer, etching is performed to concurrently form the device region and the core member which is not lifted-off in the lift-off step.

7. A semiconductor device which is manufactured by a method for manufacturing a semiconductor device of claim 1.

8. A method for manufacturing a semiconductor device having a structure in which a semiconductor layer is bonded on a supporting substrate, comprising:
a device region formation step of forming a device region comprised of the semiconductor layer on a growth substrate through a lift-off layer;
a columnar member formation step of forming a columnar member on the supporting substrate;
a bonding step of bonding the semiconductor layer on the supporting substrate, and bonding the columnar member on the growth substrate;
a lift-off step of separating a bottom surface of the semiconductor layer from the growth substrate by removing the lift-off layer, and not separating the columnar member from the growth substrate; and
a step of separating the columnar member from the supporting substrate.

9. The method for manufacturing a semiconductor device of claim 8,
wherein the columnar member formation step has a sacrificing layer formation step of forming a sacrificing layer on the supporting substrate, and in the step of separating the columnar member and the supporting substrate, the sacrificing layer is removed.

10. The method for manufacturing a semiconductor device of claim 1, wherein the semiconductor layer has an n-type layer on the side of the growth substrate, and a p-type layer formed on the n-type layer.

11. The method for manufacturing a semiconductor device of claim 8,
wherein the semiconductor layer has an n-type layer on the side of the growth substrate, and a p-type layer formed on the n-type layer.

12. The method for manufacturing a semiconductor device of claim 1,
wherein, before the bonding step,
on the surface of the semiconductor layer in the device region, and on the surface of the supporting substrate, a conductive material is formed, respectively.

13. The method for manufacturing a semiconductor device of claim 8,
wherein, before the bonding step,
on the surface of the semiconductor layer in the device region, and on the surface of the supporting substrate, a conductive material is formed, respectively.

14. The method for manufacturing a semiconductor device of claim 10,
wherein an n-type electrode which is to be bonded to the n-type layer is formed, and a p-type electrode which is to be bonded to the p-type layer is formed, the leakage current flowing when a reverse voltage of 10 volts is applied across the n-type electrode and the p-type electrode being less than 10 µA.

15. The method for manufacturing a semiconductor device of claim 11,
wherein an n-type electrode which is to be bonded to the n-type layer is formed, and a p-type electrode which is to be bonded to the p-type layer is formed, the leakage current flowing when a reverse voltage of 10 volts is applied across the n-type electrode and the p-type electrode being less than 10 µA.

16. A semiconductor device which is manufactured by a method for manufacturing a semiconductor device of claim 8.

* * * * *